United States Patent
Wang

(10) Patent No.: US 10,761,954 B2
(45) Date of Patent: Sep. 1, 2020

(54) SENSOR DETECTION ARCHITECTURE

(71) Applicant: Hewlett Packard Enterprise Development LP, Houston, TX (US)

(72) Inventor: Han Wang, Sugar Land, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 220 days.

(21) Appl. No.: 15/767,628

(22) PCT Filed: Oct. 27, 2015

(86) PCT No.: PCT/US2015/057504
§ 371 (c)(1),
(2) Date: Apr. 11, 2018

(87) PCT Pub. No.: WO2017/074312
PCT Pub. Date: May 4, 2017

(65) Prior Publication Data
US 2018/0300214 A1    Oct. 18, 2018

(51) Int. Cl.
| | |
|---|---|
| G01M 3/00 | (2006.01) |
| G06F 11/30 | (2006.01) |
| G06F 11/07 | (2006.01) |
| G06F 11/16 | (2006.01) |
| G01M 3/16 | (2006.01) |
| G06F 1/20 | (2006.01) |
| H05K 7/20 | (2006.01) |

(52) U.S. Cl.
CPC ......... *G06F 11/3058* (2013.01); *G01M 3/165* (2013.01); *G06F 1/206* (2013.01); *G06F 11/0709* (2013.01); *G06F 11/0751* (2013.01); *G06F 11/16* (2013.01); *G06F 11/30* (2013.01); *G06F 11/3006* (2013.01); *H05K 7/20763* (2013.01)

(58) Field of Classification Search
CPC .... G01M 3/165; G06F 11/3058; G06F 1/206; G06F 11/16
See application file for complete search history.

(56) References Cited

U.S. PATENT DOCUMENTS

| | | | |
|---|---|---|---|
| 4,339,746 A | 7/1982 | Ulicki et al. | |
| 5,357,422 A * | 10/1994 | Kuze | G05B 19/048 700/14 |

(Continued)

FOREIGN PATENT DOCUMENTS

| | | |
|---|---|---|
| EP | 0137687 | 4/1985 |
| KR | 101286316 | 7/2013 |

OTHER PUBLICATIONS

"HWg-WLD: 2D Surface Water Leak Detector," Retrieved from Internet Aug. 18, 2015, 4 pps, <http://www.hw-group.com/products/HWg-WLD/WLD_water_leak_detection_en.html>.

(Continued)

*Primary Examiner* — Jamel E Williams
(74) *Attorney, Agent, or Firm* — Brooks, Cameron & Huebsch, PLLC

(57) ABSTRACT

In one example, a system for a sensor detection architecture includes a plurality of sensors coupled to a controller to simultaneously detect abnormalities of a physical system at more than one location of the physical system, wherein each of the plurality of sensors are coupled to at least three other sensors of the plurality of sensors.

15 Claims, 3 Drawing Sheets

(56) References Cited

U.S. PATENT DOCUMENTS

| | | | |
|---|---|---|---|
| 5,461,569 A * | 10/1995 | Hara | F02D 41/1495 |
| | | | 123/198 D |
| 6,198,628 B1 | 3/2001 | Smith | |
| 6,608,566 B1 * | 8/2003 | Davis | G01H 1/00 |
| | | | 340/870.11 |
| 8,688,614 B2 * | 4/2014 | Choe | G06F 16/215 |
| | | | 706/48 |
| 8,786,451 B2 | 7/2014 | Lee | |
| 8,973,380 B2 | 3/2015 | Bean | |
| 10,037,436 B2 * | 7/2018 | White | H04L 9/0894 |
| 2004/0205419 A1 * | 10/2004 | Liang | G06F 21/552 |
| | | | 714/57 |
| 2006/0154358 A1 * | 7/2006 | Hassanein | A01N 1/02 |
| | | | 435/284.1 |
| 2006/0200283 A1 * | 9/2006 | Furuno | B66C 13/16 |
| | | | 701/29.6 |
| 2007/0291283 A1 * | 12/2007 | Sakai | G01B 11/022 |
| | | | 356/630 |
| 2011/0056674 A1 | 3/2011 | Campbell et al. | |
| 2012/0160036 A1 * | 6/2012 | Henry | G01F 1/8404 |
| | | | 73/861.356 |
| 2012/0318368 A1 | 12/2012 | Doughty et al. | |
| 2012/0330490 A1 * | 12/2012 | Ozaki | G01D 5/2451 |
| | | | 701/22 |
| 2014/0253140 A1 * | 9/2014 | Gilbert | A61B 18/1206 |
| | | | 324/527 |
| 2014/0266744 A1 | 9/2014 | Lyon | |
| 2015/0116118 A1 | 4/2015 | Yu | |
| 2015/0177403 A1 * | 6/2015 | Haugen | E21B 47/0001 |
| | | | 73/152.47 |
| 2019/0227895 A1 * | 7/2019 | Noguchi | G06F 11/328 |

OTHER PUBLICATIONS

"Leak Detection," Retrieved from Internet Aug. 18, 2015, 1 pp., <http://www.emersonnetworkpower.com/en-US/Products/PrecisionCooling/Cooling-Monitoring/Leak-Detection/Pages/Default.aspx>.

"Ten Steps to Increasing Data Center Efficiency and Availability through Infrastructure Monitoring," Nov. 3, 2011, 16 pps., <http://www.emersonnetworkpower.com/documentation/en-us/brands/liebert/documents/white%20papers/data-center-infrastructure_24651-r11-11.pdf>.

* cited by examiner

SENSOR DETECTION ARCHITECTURE

BACKGROUND

Computing systems can utilize a number of additional systems to support the functionality of the computing systems. For example, computing systems can utilize air cooling and/or liquid cooling systems to support the functionality of the computing systems. In some examples, a failure of a liquid cooling system can cause a number of failures of the computing system. For example, a failure of the liquid cooling system can cause the computing system to overheat and/or fail to function. In another example, a failure of the liquid cooling system can include a leak in the liquid cooling system, which can cause physical damage to computing components of the computing system. In some examples, it can be important to identify a failure of additional systems that support the functionality of computing systems and/or other types of systems.

DETAILED DESCRIPTION

Figure 1:
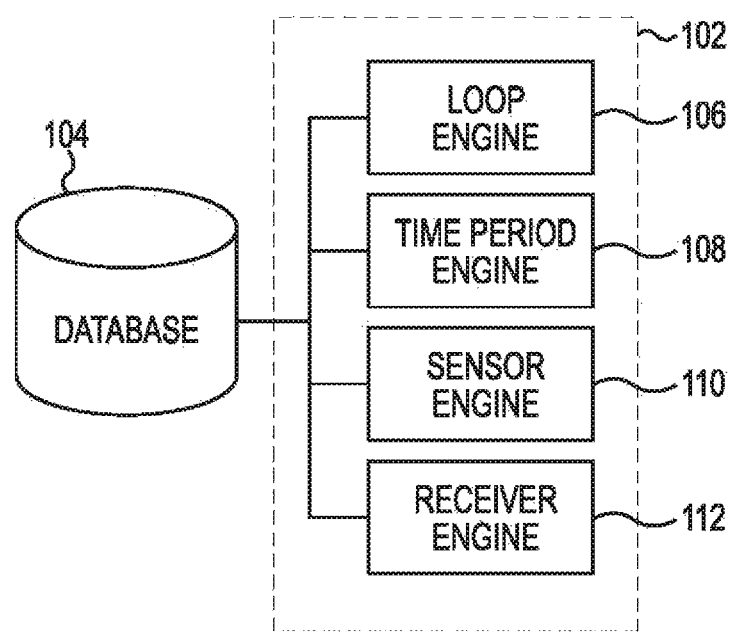
FIG. 1 illustrates a diagram of an example of a system for a sensor detection architecture consistent with the present disclosure.

A number of examples for a sensor detection architecture are described herein. In one example, a system for a sensor detection architecture includes a plurality of sensors coupled to a controller to simultaneously detect abnormalities of a physical system at more than one location of the physical system, wherein each of the plurality of sensors are coupled to at least three other sensors of the plurality of sensors. In another example, a system for a sensor detection architecture includes a first plurality of sensors coupled in-line between a detector and a terminator and a second plurality of sensors coupled in-line and parallel to the first plurality of sensors, wherein a portion of the second plurality of sensors are coupled to a portion of the first plurality of sensors.

The system for a sensor detection architecture can utilize a plurality of sensors that are coupled together to allow a controller to determine system faults in a plurality of different locations simultaneously. In previous solutions, it may not be possible to determine system faults in more than one location. That is, in previous solutions, a number of sensors can be coupled in-line (e.g., coupled in series, coupled together end to end, etc.) and when a first sensor closer to a detector or controller detects a first failure, a second sensor further from the detector or controller may not be able to notify the detector or controller that there is a second failure at the second sensor.

The system for a sensor detection architecture can include a controller and/or detector that can be utilized to activate a portion of the plurality of sensors and deactivate a portion of the plurality of sensors to determine if there are failures at a particular location of a computing system. In some examples, the plurality of sensors can include sensors to detect abnormalities of a physical system. For example, the plurality of sensors can include sensors to detect environmental features (e.g., presence of liquid, temperature, humidity, air speed, etc.) within a computing system (e.g., server rack, data center, etc.). In a specific example, the plurality of sensors can be liquid sensors to detect when there is a leak in a liquid cooling system of a computing system.

The system for a sensor detection architecture can enable simultaneous detection of a plurality of abnormalities (e.g., failures, environmental feature out of a range, environmental feature present, environmental feature over a threshold value, etc.) at different locations of a physical system such as a computing system. In addition, the system for a sensor detection architecture can be utilized to identify a location of the detected abnormalities. In some examples, the location of the detected abnormalities can be utilized to deactivate resources in the location and/or alert users that the location may include an abnormality.

The figures herein follow a numbering convention in which the first digit corresponds to the drawing figure number and the remaining digits identify an element or component in the drawing. Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

Figure 2:
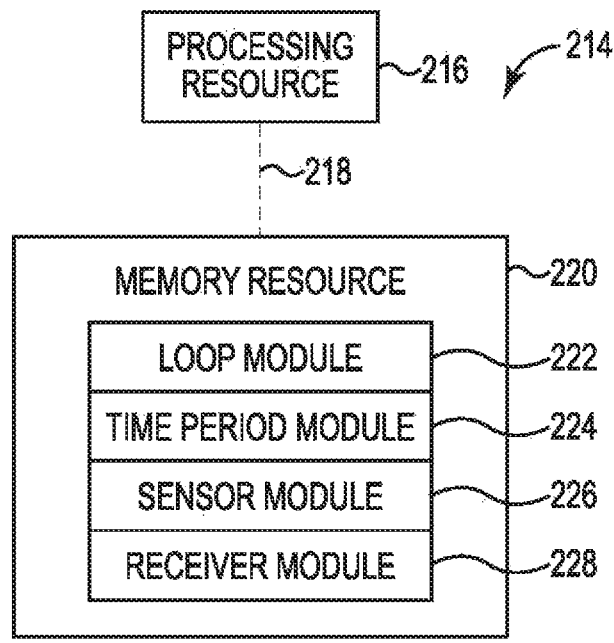
FIG. 2 illustrates a diagram of an example computing device for a sensor detection architecture consistent with the present disclosure.

FIGS. 1 and 2 illustrate examples of system and computing device 214 consistent with the present disclosure. FIG. 1 illustrates a diagram of an example of a system for a sensor detection architecture consistent with the present disclosure. The system can include a database 104, a detection architecture system 102, and/or a number of engines (e.g., loop engine 106, time period engine 108, sensor engine 110, receiver engine 112, etc.). The detection architecture system 102 can be in communication with the database 104 via a communication link, and can include the number of engines (e.g., loop engine 106, time period engine 108, sensor engine 110, receiver engine 112, etc.). The detection architecture system 102 can include additional or fewer engines than are illustrated to perform the various functions as will be described in further detail in connection with FIGS. 3-4.

The number of engines (e.g., loop engine 106, time period engine 108, sensor engine 110, receiver engine 112, etc.) can include a combination of hardware and programming, but at least hardware, that is configured to perform functions described herein (e.g., determine a number of sensor loops for a sensor detection architecture, wherein the sensor detection architecture includes a plurality of sensors that are each coupled to at least three other sensors of the plurality of sensors, determine a detection time period for each of the number of sensor loops, deactivate a portion of the plurality of sensors outside one of the number of sensor loops for a corresponding detection time period, receive sensor information from a portion of the plurality of sensors inside the one of the number of sensor loops during the corresponding detection time period, etc.) stored in a memory resource (e.g., computer readable medium, machine readable medium, etc.) as well as hard-wired program (e.g., logic).

The loop engine 106 can include hardware and/or a combination of hardware and programming, but at least hardware, to determine a number of sensor loops for a sensor detection architecture, wherein the sensor detection architecture includes a plurality of sensors that are each coupled to at least three other sensors of the plurality of sensors. Determining the number of sensor loops can include determining a number of locations of a computing system such as a server and/or data center. For example, the number of sensor loops can include a first sensor coupled to a controller and a plurality of sensors coupled to the first sensor, where the plurality of sensors are located at a particular location.

In some examples, the number of sensor loops can be a plurality of sensors that are coupled in a loop configuration. For example, each of the number of loops can include a plurality of sensors that are coupled from a controller to a particular area and coupled back from the particular area to the controller. As described further herein, the number of sensor loops can be activated for a particular time period to determine if there is an abnormality in a particular area during the particular time period. In these examples, the controller can switch between the number of sensor loops to determine a number of abnormalities for a plurality of different locations simultaneously.

The time period engine 108 can include hardware and/or a combination of hardware and programming, but at least hardware, to determine a detection time period for each of the number of sensor loops. In some example, each of the number of sensor loops can have a different corresponding time period where the number of sensors in the sensor loop are activated and/or a number of sensors outside the sensor loop are deactivated. In some examples, the controller can be utilized to detect abnormalities at each of a plurality of different locations simultaneously by having a different time period of detection for each of the plurality of different locations.

The sensor engine 110 can include hardware and/or a combination of hardware and programming, but at least hardware, to deactivate a portion of the plurality of sensors outside one of the number of sensor loops for a corresponding detection time period. Deactivating the portion of the plurality of sensors outside one of the number of sensor loops can enable the controller to detect abnormalities based on sensor information received from sensors within the one of the number of sensor loops. In some examples, the controller can determine that there is an abnormality in a first area that corresponds to a first sensor loop and also determine that there is an abnormality in a second area that corresponds to a second sensor loop.

The receiver 112 can include hardware and/or a combination of hardware and programming, but at least hardware, to receive sensor information from a portion of the plurality of sensors inside the one of the number of sensor loops during the corresponding detection time period. As described herein, receiving sensor information from the portion of the plurality of sensors can include utilizing a controller coupled to the plurality of sensors to receive and analyze information from each of the plurality of sensors.

FIG. 2 illustrates a diagram of an example computing device 214 consistent with the present disclosure. The computing device 214 can utilize software, hardware, firmware, and/or logic to perform functions described herein.

The computing device 214 can be any combination of hardware and program instructions configured to share information. The hardware, for example, can include a processing resource 216 and/or a memory resource 220 (e.g., computer-readable medium (CRM), machine readable medium (MRM), database, etc.). A processing resource 216, as used herein, can include any number of processors capable of executing instructions stored by a memory resource 220. Processing resource 216 may be implemented in a single device or distributed across multiple devices. The program instructions (e.g., computer readable instructions (CRI)) can include instructions stored on the memory resource 220 and executable by the processing resource 216 to implement a function (e.g., determine a number of sensor loops for a sensor detection architecture, wherein the sensor detection architecture includes a plurality of sensors that are each coupled to at least three other sensors of the plurality of sensors, determine a detection time period for each of the number of sensor loops, deactivate a portion of the plurality of sensors outside one of the number of sensor loops for a corresponding detection time period, receive sensor information from a portion of the plurality of sensors inside the one of the number of sensor loops during the corresponding detection time period, etc.).

The memory resource 220 can be in communication with a processing resource 216. A memory resource 220, as used herein, can include any number of memory components capable of storing instructions that can be executed by processing resource 216. Such memory resource 220 can be a non-transitory CRM or MRM. Memory resource 220 may be integrated in a single device or distributed across multiple devices. Further, memory resource 220 may be fully or partially integrated in the same device as processing resource 216 or it may be separate but accessible to that device and processing resource 216. Thus, it is noted that the computing device 214 may be implemented on a participant device, on a server device, on a collection of server devices, and/or a combination of the participant device and the server device.

The memory resource 220 can be in communication with the processing resource 216 via a communication link (e.g., a path) 218. The communication link 218 can be local or remote to a machine (e.g., a computing device) associated with the processing resource 216. Examples of a local communication link 218 can include an electronic bus internal to a machine (e.g., a computing device) where the memory resource 220 is one of volatile, non-volatile, fixed, and/or removable storage medium in communication with the processing resource 216 via the electronic bus.

A number of modules (e.g., loop module 222, time period module 224, sensor module 226, receiver module 228) can include CRI that when executed by the processing resource 216 can perform functions. The number of modules (e.g., loop module 222, time period module 224, sensor module 226, receiver module 228) can be sub-modules of other modules. For example, the loop module 222 and the time period module 224 can be sub-modules and/or contained within the same computing device. In another example, the number of modules (e.g., loop module 222, time period module 224, sensor module 226, receiver module 228) can comprise individual modules at separate and distinct locations (e.g., CRM, etc.).

Each of the number of modules (e.g., loop module 222, time period module 224, sensor module 226, receiver module 228) can include instructions that when executed by the processing resource 216 can function as a corresponding engine as described herein. For example, the loop module 222 can include instructions that when executed by the processing resource 216 can function as the loop engine 106.

Figure 3:
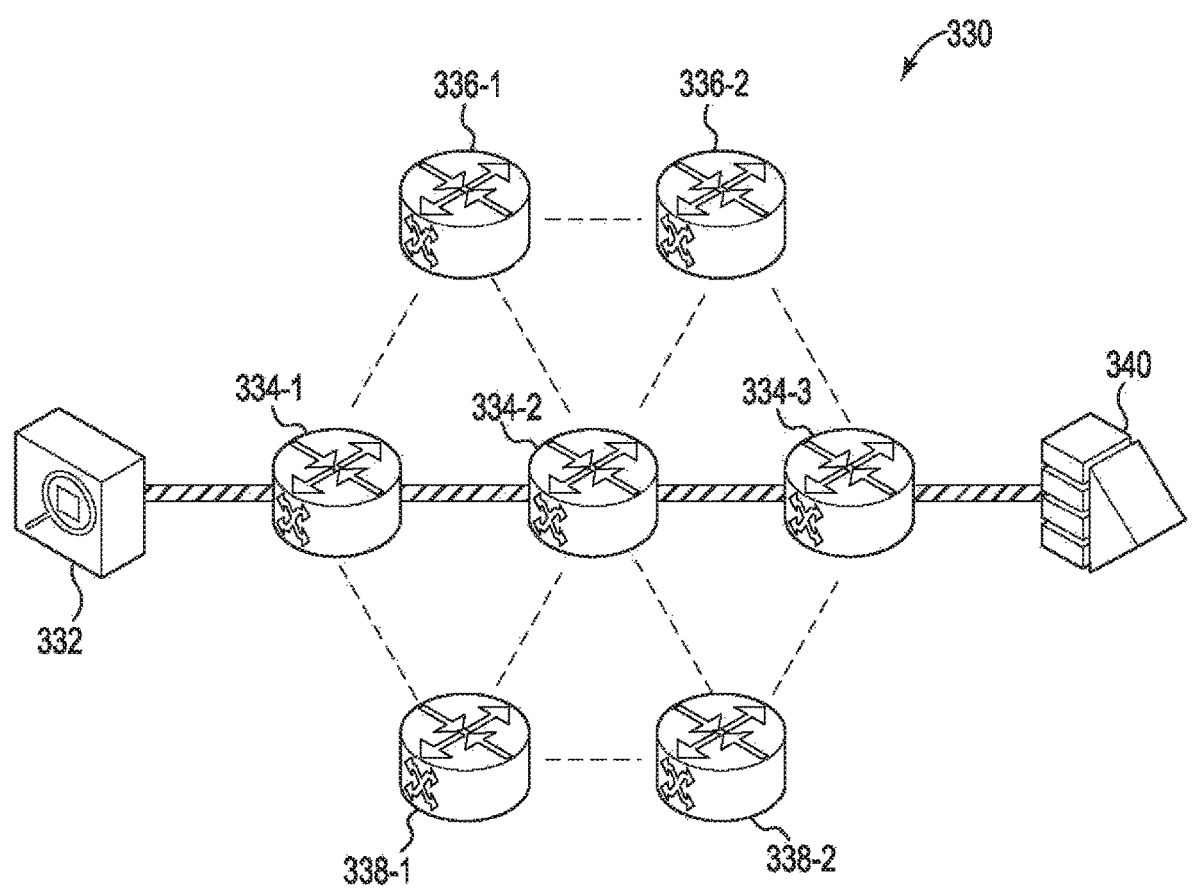
FIG. 3 illustrates a diagram of an example of a system for a sensor detection architecture consistent with the present disclosure.

FIG. 3 illustrates a diagram of an example of a system 330 for a sensor detection architecture consistent with the present disclosure. The system 330 can be utilized to simultaneously detect abnormalities of a computing system that are occurring at a plurality of different locations. As described herein, previous solutions utilized a plurality of sensors coupled to a controller, but were unable to detect multiple abnormalities of a computing system. In some examples, the system 330 can include a plurality of sensors 334-1, 334-2, 334-3, 336-1, 336-2, 338-1, 338-2 that are distributed across a plurality of locations of a computing system (e.g., server, server rack, data center, etc.).

In some examples, the system 330 can include a controller 332. The controller 332 can be a system similar to the system as referenced in FIG. 1 and/or a computing device similar to computing device 214 as referenced in FIG. 2. In some examples, the controller 332 can activate and deactivate each of the plurality of sensors 334-1, 334-2, 334-3, 336-1, 336-2, 338-1, 338-2. In some examples, the controller 332 can be utilized to determine a number of sensor loops for the plurality of sensors 334-1, 334-2, 334-3, 336-1, 336-2, 338-1, 338-2. As described herein, the number of sensor loops can be utilized to monitor particular locations of a system such as a computing system.

In some examples, the plurality of sensors 334-1, 334-2, 334-3, 336-1, 336-2, 338-1, 338-2 can each include a number of environmental sensors (e.g., temperature sensors, water sensors, humidity sensors, etc.) to detect abnormalities in a physical computing system. As described herein, the abnormalities can be environmental abnormalities of a physical computing system. For example, the abnormalities can include the presence of liquid at or near computing components, which could represent that a liquid cooling system of the computing system has a leak.

In some examples, the plurality of sensors 334-1, 334-2, 334-3, 336-1, 336-2, 338-1, 338-2 can each include a switch that can be utilized to couple each of the plurality of sensors 334-1, 334-2, 334-3, 336-1, 336-2, 338-1, 338-2 to a plurality of other sensors. For example, sensor 334-2 can be coupled to sensors 334-1, 334-3, 336-1, 336-3, 338-1, 338-2. In this example, the sensor 334-2 can include a switch to couple the sensor 334-2 to six other sensors 334-1, 334-3, 336-1, 336-3, 338-1, 338-2. In some examples, the switch of each of the plurality of sensors 334-1, 334-2, 334-3, 336-1, 336-2, 338-1, 338-2 can be utilized to create the sensor loop. For example, the switch can activate and/or deactivate particular connections (e.g., electrical connections, sense connections, communication connections, etc.) that are utilized to couple each of the plurality of sensors 334-1, 334-2, 334-3, 336-1, 336-2, 338-1, 338-2 to other sensors and/or to the controller 332 to create a sensor loop as referenced in FIG. 4.

In some examples, the plurality of sensors 334-1, 334-2, 334-3, 336-1, 336-2, 338-1, 338-2 can be coupled to other sensors of the plurality of sensors 334-1, 334-2, 334-3, 336-1, 336-2, 338-1, 338-2 and/or the controller 332 by a number of electrical lines, a number of sense lines, and a number of communication lines. In some examples, the number of electrical lines can provide power to a sensor corresponding to each of the plurality of sensors 334-1, 334-2, 334-3, 336-1, 336-2, 338-1, 338-2 and/or a switch corresponding to each of the plurality of sensors 334-1, 334-2, 334-3, 336-1, 336-2, 338-1, 338-2. In some examples, the number of sense lines can include connections to allow for sending and/or receiving sensor information (e.g., data relating to detections of the sensor, etc.). In some examples, the number of communication lines can be utilized to communicate with each of the plurality of sensors 334-1, 334-2, 334-3, 336-1, 336-2, 338-1, 338-2 and/or switches corresponding to each of the plurality of sensors 334-1, 334-2, 334-3, 336-1, 336-2, 338-1, 338-2. In some examples, the number of electrical lines, communication lines, and sense lines can be utilized to detect abnormalities, activate a portion of the plurality of sensors 334-1, 334-2, 334-3, 336-1, 336-2, 338-1, 338-2, and/or deactivate a portion of the plurality of sensors 334-1, 334-2, 334-3, 336-1, 336-2, 338-1, 338-2.

The system 330 can include a plurality of sensors 334-1, 334-2, 334-3, 336-1, 336-2, 338-1, 338-2 that are coupled together in a number of parallel in-line configurations. As used herein, a number of sensors that are coupled in-line includes a number of sensors that are coupled in series and/or are coupled end-to-end to form a line of sensors. For example, a first sensor 334-1 can be coupled to a second sensor 334-2 and the second sensor 334-2 can be coupled to a third sensor 334-3 to form a line of sensors that includes the first sensor 334-1, the second sensor 334-2, and the third sensor 334-3. As used herein, a parallel configuration includes a first number of in-line sensors that are coupled to a second number of in-line sensors, where the first number of sensors are not in-line with the second number of sensors. For example, a first sensor 334-1, a second sensor 334-2, and a third sensor 334-3 can be coupled in-line (e.g., in series, etc.) to form a first sensor line. In this example, a fourth sensor 336-1 and a fifth sensor 336-2 can form a second sensor line. In this example, the first sensor line is not in-line with the second sensor line and is coupled to the first sensor line in a parallel configuration.

In some examples, a first number of sensors 334-1, 334-2, 334-3 can be coupled between the controller 332 and a terminator 340. As used herein, a terminator 340 can be utilized to ensure signal integration between each of the plurality of sensors 334-1, 334-2, 334-3, 336-1, 336-2, 338-1, 338-2. The first number of sensors 334-1, 334-2, 334-3 can be parallel with a second number of sensors 336-1, 336-2. In some examples, the first number of sensors 334-1, 334-2, 334-3 can each be coupled to a number of sensors from the second number of sensors 336-1, 336-2. For example, sensor 334-1 from the first number of sensors 334-1, 334-2, 334-3 can be coupled to sensor 336-1 from the second number of sensors 336-1, 336-2.

In some examples, the first number of sensors 334-1, 334-2, 334-3 can also be coupled to a third number of sensors 338-1, 338-2 that are parallel to the first number of sensors 334-1, 334-2, 334-3 and/or parallel to the second number of sensors 336-1, 336-2. In some examples, the system 330 can be expanded with a plurality of additional sensors that can be coupled in parallel to the second number of sensors 336-1, 336-2 and/or coupled in parallel to the third number of sensors 338-1, 338-2. For example, sensor 338-1 can be coupled to an additional number of sensors similarly to how sensor 338-1 is coupled to sensor 334-1 and sensor 334-2.

In previous solutions a plurality of sensors can be coupled in-line in a loop configuration over an area of a computing system. These systems and methods can be limited to detecting abnormalities to a single location since a controller connected to the plurality of sensors may not be able to determine when there are multiple abnormalities along the line of sensors. The system 330 can be utilized to detect a plurality of different abnormalities that are simultaneously occurring at different locations of the computing system. For example, the controller 332 can determine a number of sensor loops from the plurality of sensors 334-1, 334-2, 334-3, 336-1, 336-2, 338-1, 338-2 and for a corresponding time period, the controller 332 can deactivate sensors that are outside of the corresponding sensor loop to detect abnormalities within the sensor loop during the corresponding time period. As described further herein in reference to FIG. 4, a particular number of sensors can be selected to be activated and a particular number of sensors can be selected to be deactivated so a sensor loop is selected.

In some examples, a quantity of controllers 332 and/or terminators 340 can be increased and/or decreased based on a scale of the system 330. For example, relatively larger systems can utilize a relatively larger quantity of controllers 332 and/or terminators 340 to provide the functions described herein. In some examples, a plurality of controllers 332 and/or terminators 340 can be utilized to provide the functionality described herein. In some examples, the system 330 can be part of a plurality of parallel systems that are the same and/or similar to system 330. In these relatively large scale systems with a plurality of systems that are the same and/or similar to system 330, a controller 332 and/or terminator 340 can be utilized for each of the plurality of systems and/or for a number of combined systems depending on a speed of the controllers 332 and/or terminators 340.

As described herein, the plurality of sensors 334-1, 334-2, 334-3, 336-1, 336-2, 338-1, 338-2 can be liquid sensors or water sensors that can detect the presence of a liquid such as water. It can be important to detect all abnormalities, such as a liquid leak, in a computing system that utilizes a liquid cooling system. For example, it can be important to stop liquid circulation when a leak in the liquid cooling system is detected. In previous solutions, the detection of a first leak in a first location could potentially hide the existence of a second leak in a second location until the first leak is fixed. In this example, the circulation of a pump associated with the second leak may not be stopped and damage can occur at the second location.

Figure 4:
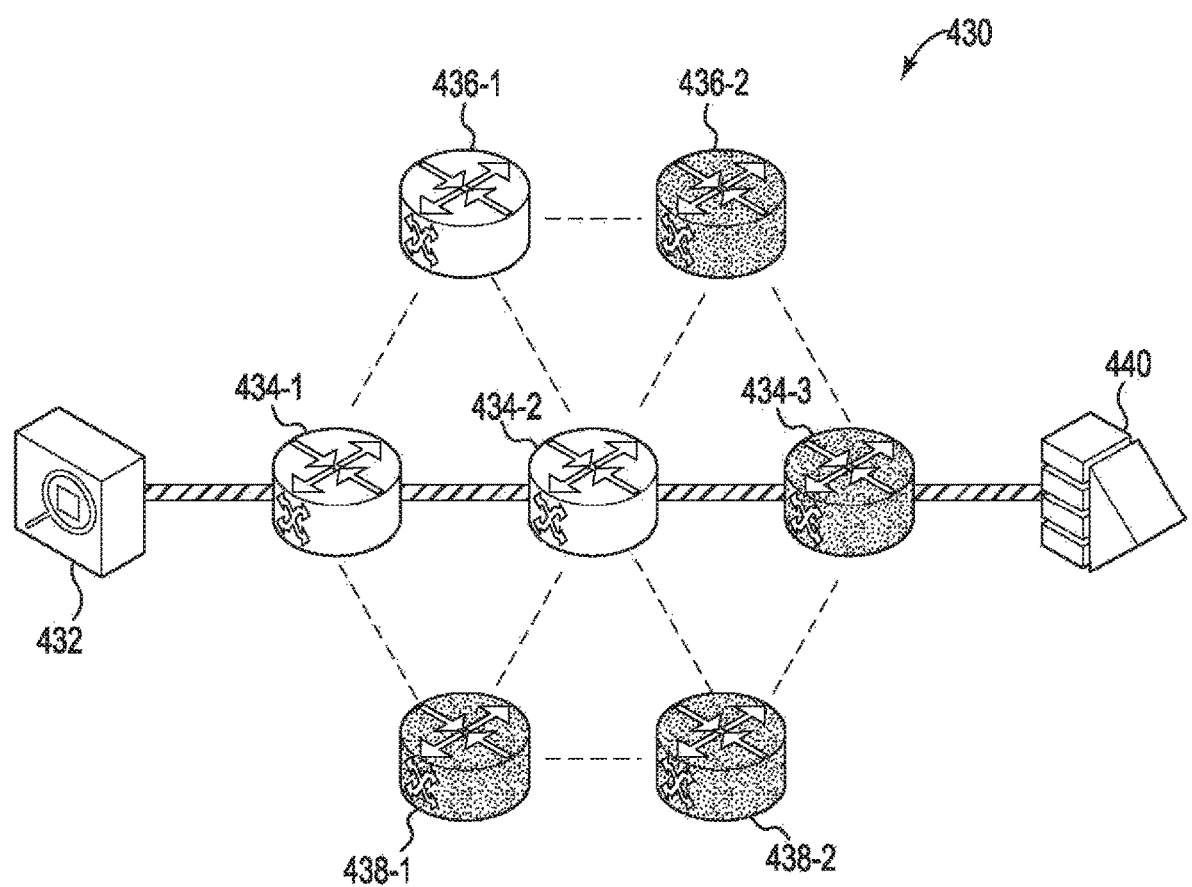
FIG. 4 illustrates a diagram of an example of a system for a sensor detection architecture consistent with the present disclosure.

FIG. 4 illustrates a diagram of an example of a system 430 for a sensor detection architecture consistent with the present disclosure. The system 430 can include the same and/or similar features as system 330. In some examples, the system 430 can include a controller 432, an eliminator 440, and/or a plurality of sensors 434-1, 434-2, 434-3, 436-1, 436-2, 438-1, 438-2. As described herein, the plurality of sensors 434-1, 434-2, 434-3, 436-1, 436-2, 438-1, 438-2 can include a corresponding switch that can be utilized to connect each of the plurality of sensors 434-1, 434-2, 434-3, 436-1, 436-2, 438-1, 438-2 to a plurality of other sensors that are in-line and parallel to each of the plurality of sensors 434-1, 434-2, 434-3, 436-1, 436-2, 438-1, 438-2.

As described herein, the controller 432 can include a system such as the system as referenced in FIG. 1 and/or a computing device such as computing device 214 as referenced in FIG. 2 to perform a number of functions as described herein. The controller 432 can determine a number of number of sensor loops and a corresponding time period for each of the number of sensor loops. As described herein, the controller 432 can activate sensors within a particular sensor loop and/or deactivate sensors outside the particular sensor loop during a corresponding time period. Thus, the controller 432 can receive sensor information from sensors within the particular sensor loop during the corresponding time period to determine if there are abnormalities within a particular area of a physical system corresponding to the location of the sensors within the sensor loop during the corresponding time period.

In one example, the controller 432 can determine a sensor loop 442. In addition, the controller 432 can determine a timer period that corresponds to the sensor loop 442. In this example, the sensor loop 442 can include a communication signal from the controller 432 that is sent to the sensor 434-1. In addition, the signal can be sent via a switch of the sensor 434-1 to sensor 434-2. In addition, the signal can be sent via a switch of the sensor 434-2 to sensor 436-1. In addition, the signal can be sent via a switch of the sensor 436-1 back to sensor 434-1. Furthermore, the signal can be sent via a switch of the sensor 434-1 back to the controller to complete the sensor loop 442. In some examples, the controller 432 can utilize a switch corresponding to each of the plurality of sensors 434-1, 434-2, 434-3, 436-1, 436-2, 438-1, 438-2 to activate and/or deactivate a portion of the plurality of sensors 434-1, 434-2, 434-3, 436-1, 436-2, 438-1, 438-2 to create the sensor loop 442 as described herein.

In some examples, the sensor loop 442 can correspond to a particular area within a system such as a computing system. When the controller 432 determines that the time period for the sensor loop 442 has completed, the controller 432 can activate a number of sensors for a different loop and/or deactivate a number of sensors that are not within a different loop to detect abnormalities within a different area of the system. In some examples, the controller 432 can alter to a different sensor loop after each time period corresponding to each sensor loop to determine abnormalities over the entire system.

As described herein, the controller 432 can determine a plurality of abnormalities at a plurality of different locations simultaneously. In some examples, the controller 432 can simultaneously determine abnormalities at a plurality of different locations by alternating between a number of sensor loops for a particular time period to determine when there are abnormalities within a particular sensor loop during a corresponding time period. For example, the controller 432 may detect an abnormality within the sensor loop 442. In this example, the controller 432 can notify a user that an abnormality exists at the location corresponding to the sensor loop 442. In addition, the controller 432 can switch to a different sensor loop and detect another abnormality within the different sensor loop even though an abnormality was already detected at the sensor loop 442. In previous solutions, the detection of the abnormality within sensor loop 442 could have prevented the detection of the abnormality at the different sensor loop. Thus, the controller 432 can detect a plurality of different abnormalities throughout the system even when there are existing abnormalities detected within the system.

As used herein, "logic" is an alternative or additional processing resource to perform a particular action and/or function, etc., described herein, which includes hardware, e.g., various forms of transistor logic, application specific integrated circuits (ASICs), etc., as opposed to computer executable instructions, e.g., software firmware, etc., stored in memory and executable by a processor. Further, as used herein, "a" or "a number of" something can refer to one or more such things. For example, "a number of widgets" can refer to one or more widgets.

The above specification, examples and data provide a description of the method and applications, and use of the system and method of the present disclosure. Since many examples can be made without departing from the spirit and scope of the system and method of the present disclosure, this specification merely sets forth some of the many possible example configurations and implementations.

What is claimed:
1. A system for sensor detection architecture, comprising:
a plurality of sensors coupled to a controller to simultaneously detect abnormalities of a physical system at more than one location of the physical system, wherein each of the plurality of sensors are coupled to at least three other sensors of the plurality of sensors, wherein the controller determines a number of sensor loops for the sensor detection architecture, and wherein the controller further deactivates a portion of the plurality of sensors outside one of the number of sensor loops for a detection time period corresponding to the one of the number of sensor loops.

2. The system of claim 1, wherein the controller activates a portion of the plurality of sensors to detect abnormalities at a specific location of the physical system.

3. The system of claim 2, wherein the controller activates a portion of the plurality of sensors to create a sensor loop to detect abnormalities at the specific location of the physical system.

4. The system of claim 1, wherein each of the plurality of sensors are coupled to the controller by a number of electrical lines, a number of sense lines, and a number of communication lines.

5. The system of claim 1, wherein each of the plurality of sensors include a number of switches.

6. The system of claim 1, wherein the controller deactivates a portion of the plurality sensors to detect abnormalities at a specific location of the physical system.

7. The system of claim 1, wherein the controller activates and deactivates each of the plurality of sensors to detect abnormalities of each of a plurality of locations of the physical system over a period of time.

8. A non-transitory computer readable medium storing instructions executable by a processor for sensor detection with a sensor detection architecture, wherein the instructions are executable to:
   determine a number of sensor loops for the sensor detection architecture, wherein the sensor detection architecture includes a plurality of sensors that are each coupled to at least three other sensors of the plurality of sensors;
   determine a detection time period for each of the number of sensor loops;
   deactivate a portion of the plurality of sensors outside one of the number of sensor loops for a corresponding detection time period; and
   receive sensor information from a portion of the plurality of sensors inside the one of the number of sensor loops during the corresponding detection time period.

9. The medium of claim 8, wherein a portion of the plurality of sensors are coupled in-line between a detector and a terminator.

10. The medium of claim 9, wherein each of the portion of the plurality of sensors are coupled to at least two sensors from the plurality of sensors that are outside the portion of the plurality of sensors coupled in-line between a detector and a terminator.

11. The medium of claim 10, wherein the at least two sensors are coupled to an additional sensor that is outside the portion of the plurality of sensors coupled in-line between a detector and a terminator.

12. A system for sensor detection architecture, comprising:
   a first plurality of sensors coupled in-line between a detector and a terminator; and
   a second plurality of sensors coupled in-line and parallel to the first plurality of sensors, wherein a portion of the second plurality of sensors are coupled to a portion of the first plurality of sensors,
   wherein the detector determines a number of sensor loops for the sensor detection architecture, and
   wherein the detector further deactivates a portion of the first or second plurality of sensors outside one of the number of sensor loops for a detection time period corresponding to the one of the number of sensor loops.

13. The system of claim 12, comprising a third plurality of sensors coupled in-line and parallel to the first plurality of sensors and to the second plurality of sensors, wherein a portion of the third plurality of sensors are coupled to a portion of the first plurality of sensors.

14. The system of claim 13, wherein the second plurality of sensors and third plurality of sensors are coupled to the detector via at least one sensor of the first plurality of sensors.

15. The system of claim 12, wherein the second plurality of sensors and third plurality of sensors are coupled to the terminator via at least one sensor of the first plurality of sensors.

* * * * *